(12) United States Patent  
Sugibayashi

(10) Patent No.: US 6,378,118 B1  
(45) Date of Patent: Apr. 23, 2002

(54) SEMICONDUCTOR INTEGRATED CIRCUIT HAVING A MPU AND A DRAM CACHE MEMORY

(75) Inventor: Tadahiko Sugibayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/427,088

(22) Filed: Oct. 26, 1999

(30) Foreign Application Priority Data

Oct. 26, 1998 (JP) .......................................... 10-304056

(51) Int. Cl.[7] .............................................. G06F 17/50
(52) U.S. Cl. .................................. 716/8; 716/9; 716/10
(58) Field of Search ............................. 712/1; 257/758, 257/701; 709/250; 361/735, 744, 761, 764, 733, 803, 813; 716/1–18

(56) References Cited

U.S. PATENT DOCUMENTS 5,594,279 A * 1/1997 Itou et al. ................... 257/758
5,767,575 A * 6/1998 Lan et al. .................... 257/701
5,822,603 A * 10/1998 Hansen et al. .................. 712/1

* cited by examiner

Primary Examiner—Matthew Smith
Assistant Examiner—Naum Levin
(74) Attorney, Agent, or Firm—McGinn & Gibb, PLLC

(57) ABSTRACT

A large scale semiconductor integrated circuit, implemented on a chip, includes an MPU and a DRAM cache memory including a plurality of DRAM macro blocks located around the MPU. The DRAM macro block has a redundancy function for which a plurality of fuses are disposed for cut-out by laser beams. The lower metallic layers implement source lines for power and ground to the DRAM macro blocks, whereas a topmost metallic layer implements source lines for the MPU. The topmost metallic layer circumvents areas of the chip where portions of a metallic layer constituting fuses for implementing the redundancy function are located.

17 Claims, 7 Drawing Sheets

SEMICONDUCTOR INTEGRATED CIRCUIT HAVING A MPU AND A DRAM CACHE MEMORY

BACKGROUND OF THE INVENTION (a) Field of the Invention

The present invention relates to a semiconductor integrated circuit having a micro processing unit (microprocessor) and a DRAM cache memory on a single chip and, more particularly, to the structure of interconnect lines disposed on the chip.

(b) Description of the Related Art

In view of a low operational speed of a main storage device used for a micro processing unit (MPU) in a computer system, it is usual that the MPU is associated with a cache memory having a higher operational speed. The cache memory temporarily stores some of data for the MPU to compensate the low speed of the main storage device.

In general, the cache memory devices, required to have a higher operational speed, have been implemented by static random access memories (SRAMs), which generally have a larger circuit scale per unit capacity however. Thus, a small-capacity SRAM is generally used heretofore for the cache memory.

It is desirable that a dynamic random access memory (DRAM) having a larger storage capacity per unit area be used as the cache memory for reducing the chip size of the LSI. If the cache memory is to be implemented by a DRAM, a configuration may be employed in that the MPU and bonding pads are disposed in the central area and the peripheral area, respectively, of a semiconductor chip, with the DRAM cache memory disposed between the MPU and the bonding pads.

In the LSI as described above, if the DRAM cache memory and the MPU are separately designed and combined thereafter on a chip, interconnect lines including source lines and signal lines and extending between the bonding pads and the MPU are generally arranged outside the area for the DRAM cache memory. This increases the chip size of the LSI. On the other hand, if the interconnect lines are arranged within the area for the DRAM cache memory, the location for the interconnect lines must conform to the arrangement within the DRAM cache memory. In addition, other interconnect lines extending between the bonding pads and the DRAM cache memory may retard the interconnect lines between the bonding pads and the MPU from extending along routes having minimum lengths.

Moreover, if the noise generated on the overlying interconnect lines, especially on the source line, extending between the bonding pads and the MPU is propagated through the parasitic capacitance to the word lines or the data lines disposed below the overlying interconnect lines, a malfunction may arise in the operation of the DRAM cache memory.

SUMMARY OF THE INVENTION

It is therefore an object of the present invention to provide a semiconductor integrated circuit having a MPU and a DRAM cache memory wherein overlying source lines for the DRAM cache memory can be arranged with a suitable density substantially without restriction by the arrangement of the underlying source lines.

It is another object of the present invention to provide a semiconductor integrated circuit which is capable of reducing the noise propagated from the overlying interconnect lines extending between the bonding pads and the MPU to the word lines or data lines formed as the underlying metallic interconnect lines.

It is a further object of the present invention to provide a semiconductor integrated circuit which is capable of reducing the noise propagated from the MPU to the data line of the DRAM cache memory through the source lines.

The present invention provides a semiconductor integrated circuit including a microprocessor disposed substantially in a central area of a chip, a DRAM cache memory including at least one DRAM macro block disposed adjacent to the microprocessor and having a plurality of memory cells arranged in a matrix, bonding pads disposed in a peripheral area of the chip to oppose the microprocessor with the DRAM macro block disposed therebetween, and a plurality of interconnect lines including at least one overlying source line connected between the microprocessor and one of the bonding pads and a plurality of underlying interconnect lines extending below the overlying source line in a direction substantially parallel to a direction of arrangement of the memory cells, the underlying interconnect lines being connected between the overlying source line and the DRAM macro block.

In accordance with the LSI of the present invention, by providing two-layer source lines, the underlying source line providing operating current for the DRAM macro block is less affected by the potential fluctuation of the overlying source line which is caused by the microprocessor having a higher power dissipation.

The above and other objects, features and advantages of the present invention will be more apparent from the following description, referring to the accompanying drawings.

PREFERRED EMBODIMENTS OF THE INVENTION

Figure 1:
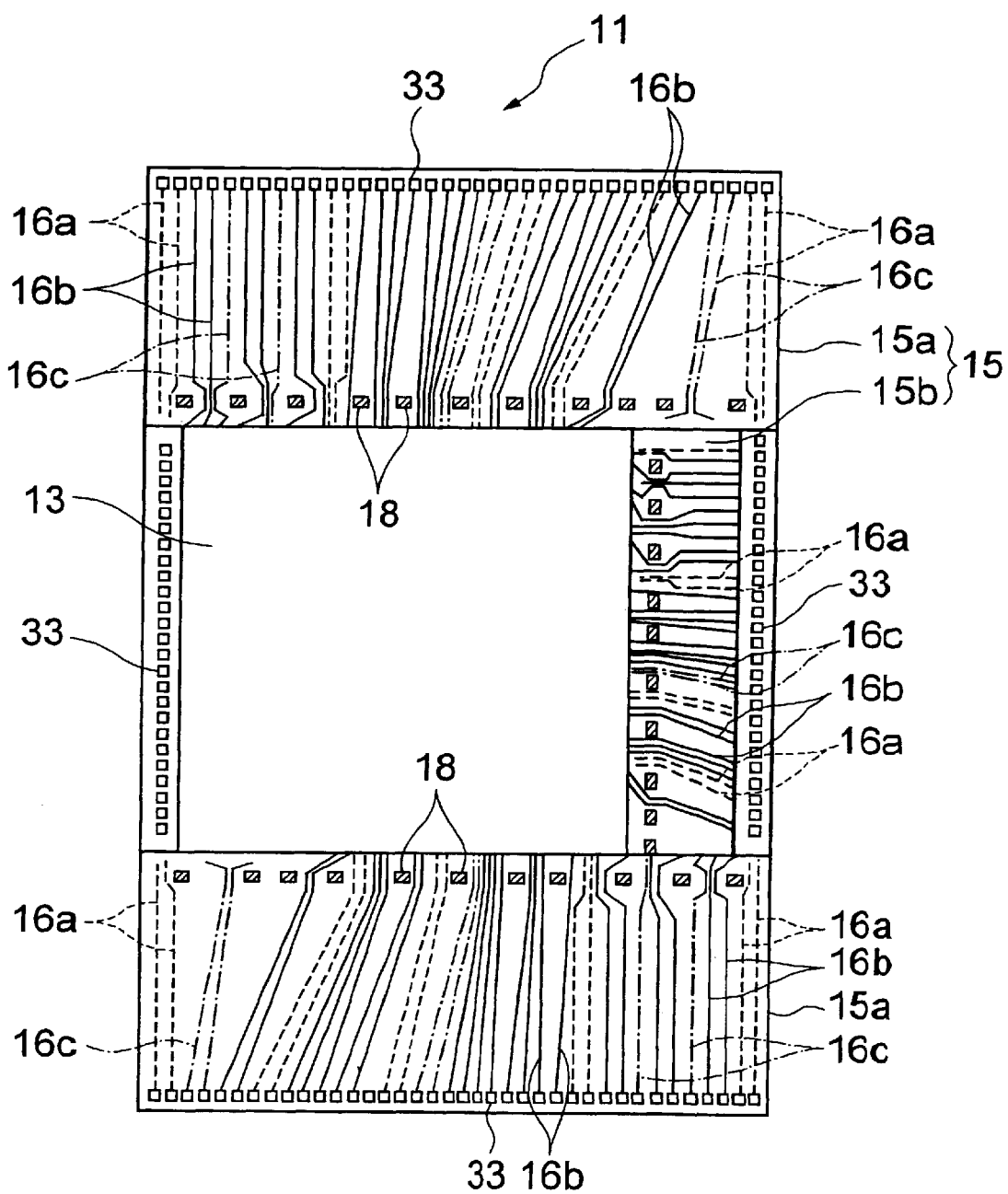
FIG. 1 is a top plan view of an LSI according to an embodiment of the present invention.

Referring to FIG. 1, an LSI 11 according to an embodiment of the present invention includes a MPU 13 located in a central area of the chip, a DRAM cache memory 15 including three DRAM macro blocks 15 and 15b disposed at the peripheral area of the chip for surrounding the MPU 13 at three sides thereof, and bonding pads 33 disposed in the vicinity of four edges of the chip.

The DRAM macro blocks include a pair of cache data macro blocks 15a, and a tag data macro block 15b, each of which has a redundancy function. The bonding pads 33 disposed in the vicinity of three edges of the chip are disposed in opposite to the MPU 13 with an intervention of the DRAM macro blocks 15a and 15b, whereas the bonding pads 33 disposed in the vicinity of the remaining edge are disposed adjacent to the MPU 13. The number of bonding pads 33 is 600, for example. The arrangement of the LSI is not depicted to any accuracy of scale.

Interconnect lines 16 depicted in the drawing includes source lines 16a for supplying electric power from the bonding pads to the MPU 13, signal lines 16b for transmitting signals between the input/output ports of the MPU 13 and the bonding pads 33, signal lines 16c for transmitting signals between the bonding pads 33 and the DRAM macro blocks 15a and 15b, and signal lines (not shown) for transmitting signals between the MPU 13 and the DRAM macro blocks 15a and 15b. The interconnect lines 16a, 16b and 16c are implemented by four-layer metallic (Al) films, among which fourth layer metallic film must not pass the locations designated by numerals 18, which prohibit passing of the interconnect layers thereabove. The area 18 receives therein fuses used for redundancy function of the DRAM macro blocks 15a and 15b.

Since the pitch of the input/output ports of the MPU 13 is smaller than the pitch of the bonding pads 33 and also the fourth layer interconnect lines 16a and 16b are restricted not to pass the area 18 in the peripheral circuit of the DRAM macro blocks 15a and 15b, most of the fourth layer Al interconnect lines including source lines 16a and signal lines 16b pass diagonally over the areas for the data DRAM macro blocks 15a and the tag DRAM macro block 15b.

In the LSI 11 of the present embodiment, the third layer Al film, as counted from the semiconductor substrate among the four-layer Al films, implements the fuse used for the redundancy function, and the fourth layer Al film implements the source lines and the signal lines for the MPU 13.

Figure 2:
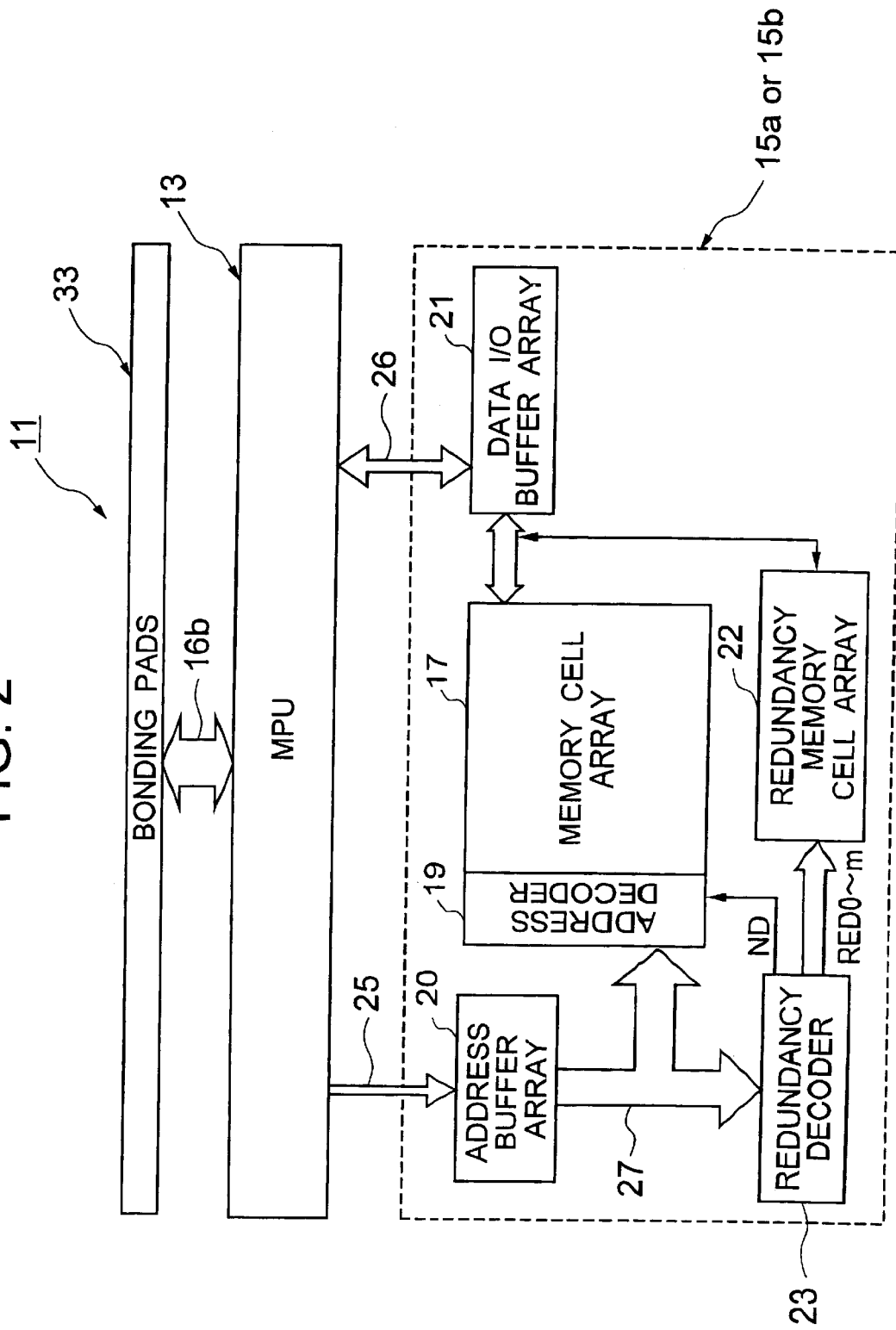
FIG. 2 is a block diagram of the LSI of FIG. 1.

Referring to FIG. 2, each DRAM macro block 15a or 15b of the cache memory 15 has a memory cell array 17, an address decoder section 19 associated with the array blocks 17, an address buffer array 20, a redundancy decoder section 23, a redundancy memory cell array 22, and data input/output buffer array 21. The redundancy memory cell array 22 and the redundancy decoder section 23 implement the redundancy function of the DRAM macro block 15a or 15b.

The MPU 13 supplies an address signal 25 to the address buffer array 20, and transfers other signals 26 between the same and the data I/O buffer array 21. The address buffer array 20 supplies the address signal 27 to the address decoder section 19 and the redundancy decoder section 23. When a defect is detected in a memory cell of the memory cell array 17, the row of the memory cell array including the defective memory cell is replaced by the row of the redundancy memory cell array 22, whereby the DRAM macro block 15a or 15b functions as a normal DRAM macro block.

Figure 3:
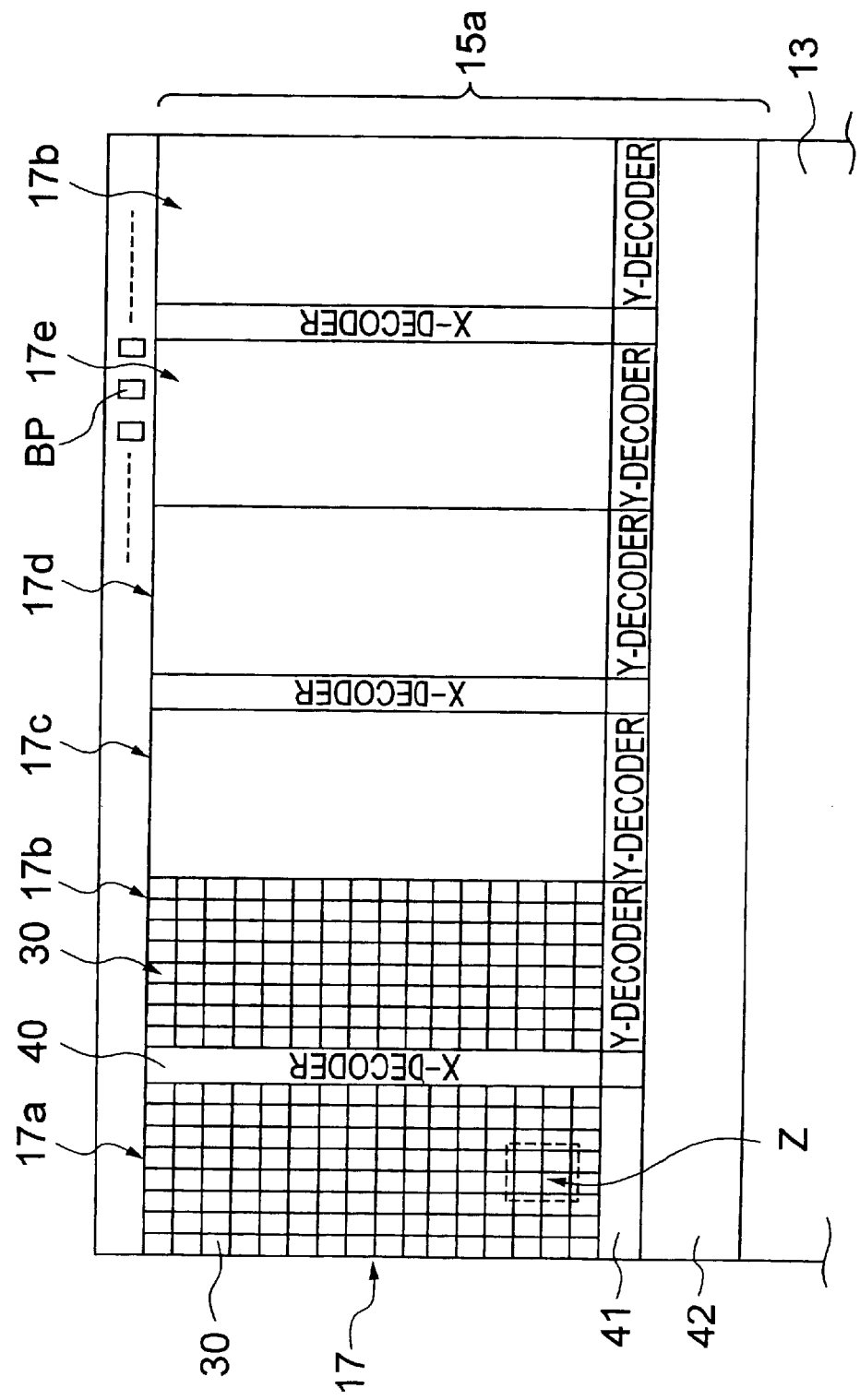
FIG. 3 is a top plan view of the DRAM macro block of the cache memory in the LSI of FIG. 1.

Referring to FIG. 3, the memory cell array 17 is separated in the row directions into a plurality of array blocks 17a to 17e. In other words, several array blocks 17a to 17e arranged in the row direction implement a DRAM macro block 15a or 15b together with a corresponding redundancy cell array block and a peripheral circuit.

Each DRAM macro block 15a or 15b includes an X-decoder 40 disposed for each pair of array blocks 17a to 17e and a Y-decoder 41 disposed for each of the array blocks 17a to 17e. Each of the array blocks 17a to 17e is also divided in the row and column directions into a plurality of sub-blocks 30, as exemplarily depicted for the two 17a and 17b of the array blocks 17a to 17e shown at the left side of the memory cell array 17. Each sub-block 30 includes several tens of thousands to several hundreds of thousands in number of memory cells, which are disposed at respective intersections between the word lines and the bit line pairs.

Between the Y-decoder 41 and the MPU 13 are disposed a peripheral circuit 42 including the redundancy fuses not shown in the figure. In this example, as described before, the third layer interconnect lines are used as fuses to be cut by laser beams after testing by a memory circuit tester. The third layer Al interconnect lines have a smaller thickness than the fourth layer Al interconnect lines, and are easy to be cut by the laser beams. Thus, the fourth layer Al interconnect lines passes around the areas 18 (FIG. 1) receiving therein portions of the third layer Al interconnect lines to be cut by the laser beam in the peripheral circuit 42.

Figure 4:
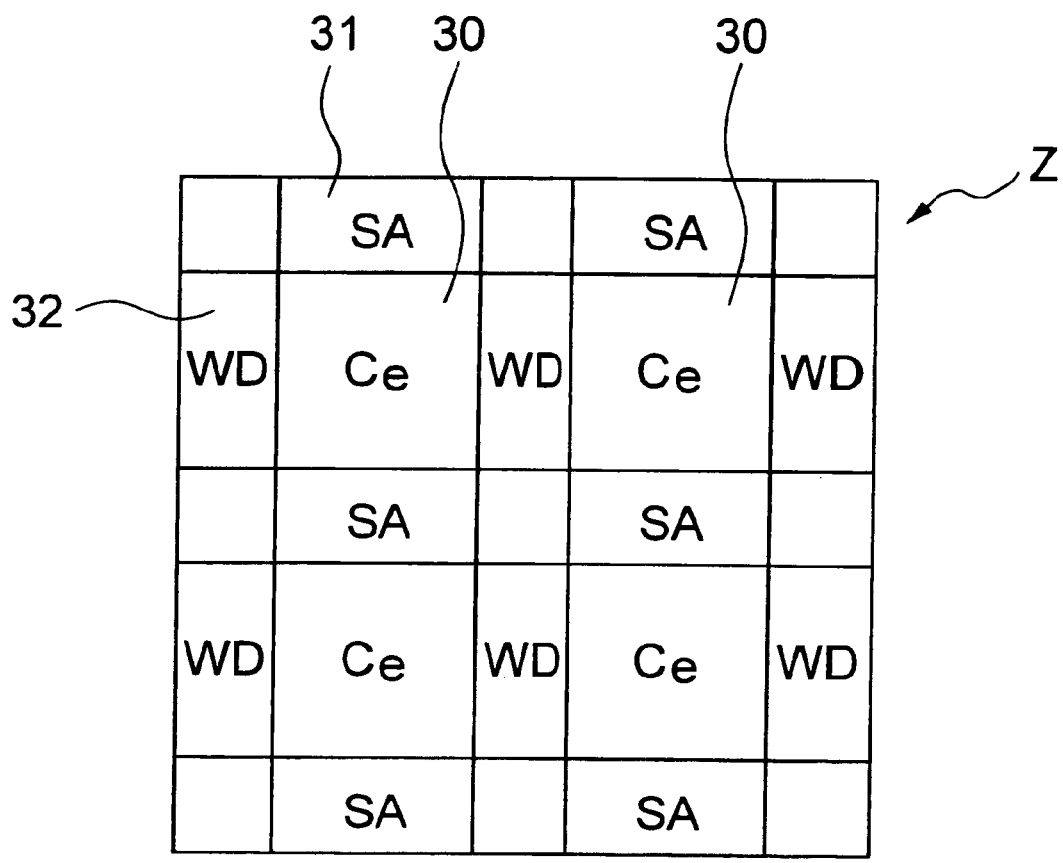
FIG. 4 is a detailed top plan view of a portion of the memory cell array shown in FIG. 3.

Referring to FIG. 4 showing the detail of area "Z" of FIG. 3 including four sub-blocks 30, a sense amplifier 31 and a word driver 32 are disposed for each sub-block 30 of the memory cells. The word driver 32 transfers the address from the X-decoder 40 whereas the sense amplifier 31 reads data from the corresponding sub-block 30 of memory cells and restore the data thereto.

Figure 5:
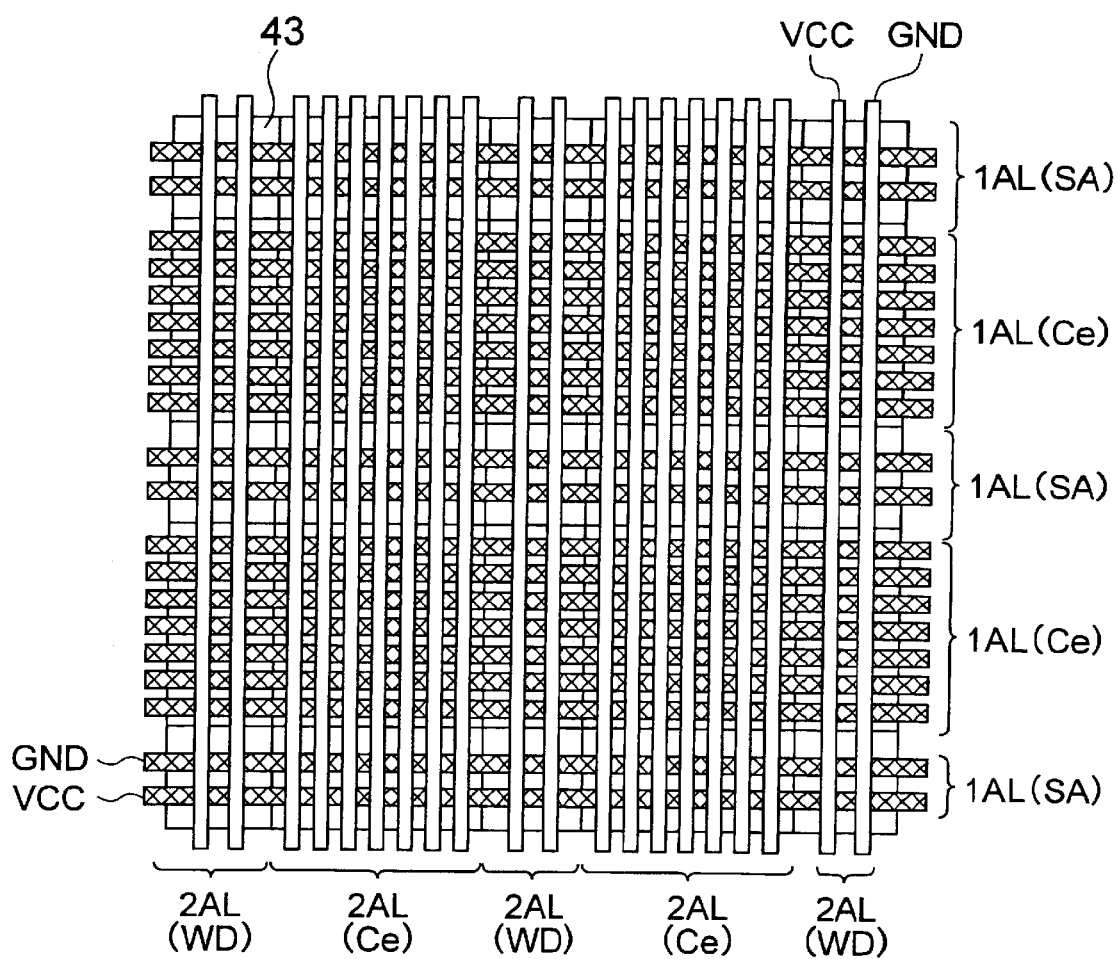
FIG. 5 is a top plan view of first and second layer aluminum (Al) lines disposed above the portion of FIG. 4.

Referring to FIG. 5 showing fist layer AL interconnect lines 1AL and second layer Al interconnect lines 2AL disposed above the memory cells in the area "Z" shown in FIG. 4, the first layer Al interconnect lines lAL extending in the row direction include data lines disposed above the memory cells (Ce) and source lines disposed above the sense amplifiers (SA). The data lines receive data from the sense amplifier (SA). The second layer interconnect lines 2AL extending in the column direction include main word lines disposed above the word drivers (WD) and source lines disposed above the memory cells (Ce).

The source lines of the first and the second layers 1AL and 2AL respectively include line pairs each including a VCC source line and a ground (GND) line. Each of the source lines extending in the column directions and a corresponding one of the source lines extending in the row directions are connected together at the intersection thereof through a via plug, whereby VCC lines as well as ground lines form a mesh of interconnect lines.

Figure 6:
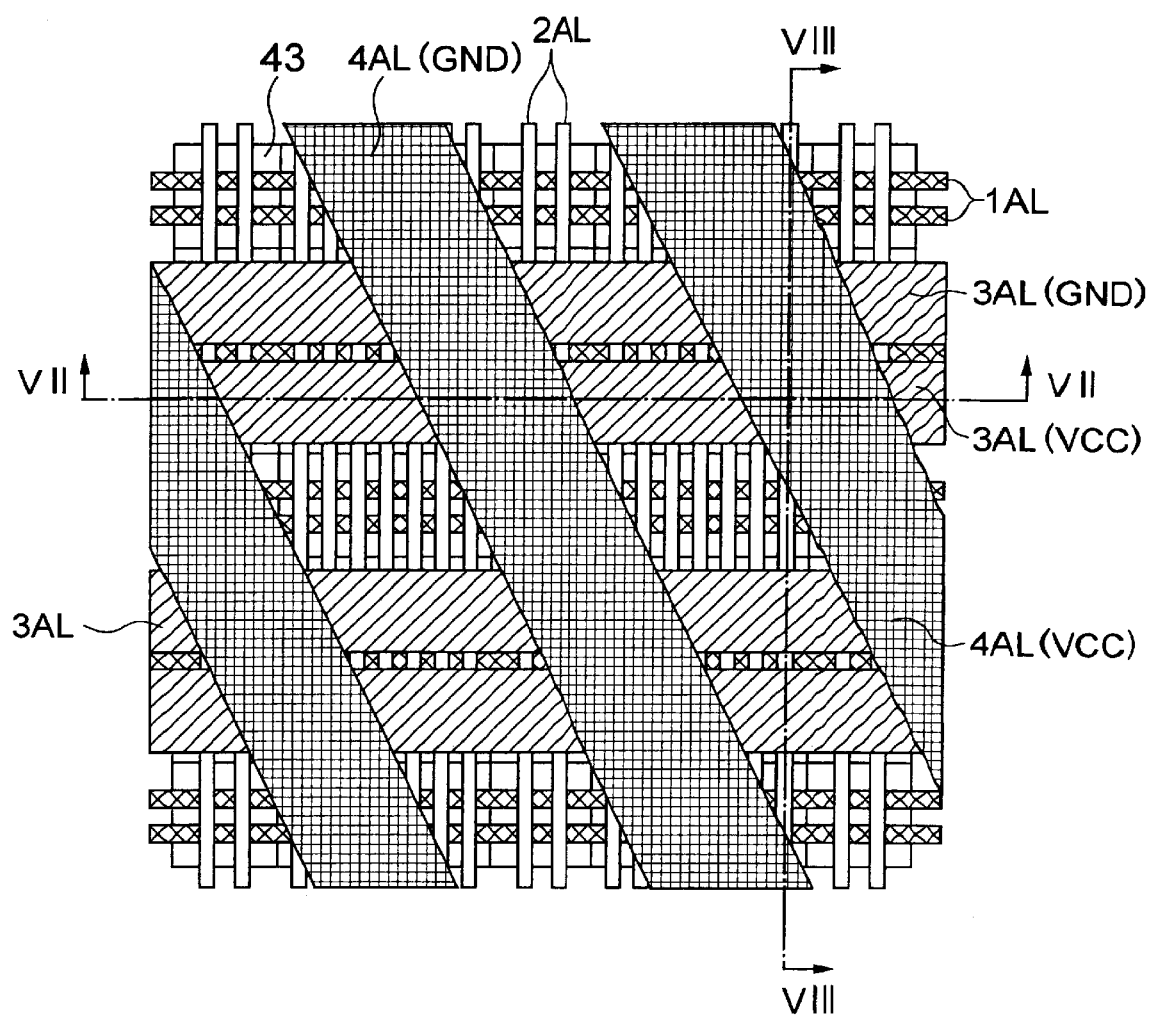
FIG. 6 is a top plan view of first through fourth layers Al lines disposed above the portion of FIG. 4.

Referring to FIG. 6, the third layer interconnect lines 3AL extend perpendicularly to the second layer interconnect lines 2AL and include line pairs each including a VCC line and a ground line both having a larger width than the second layer source lines 2AL. The fourth layer interconnect lines 4AL extend diagonally with respect to the third layer interconnect lines 3AL and also include line pairs each including a VCC line and a ground line.

Figure 7:
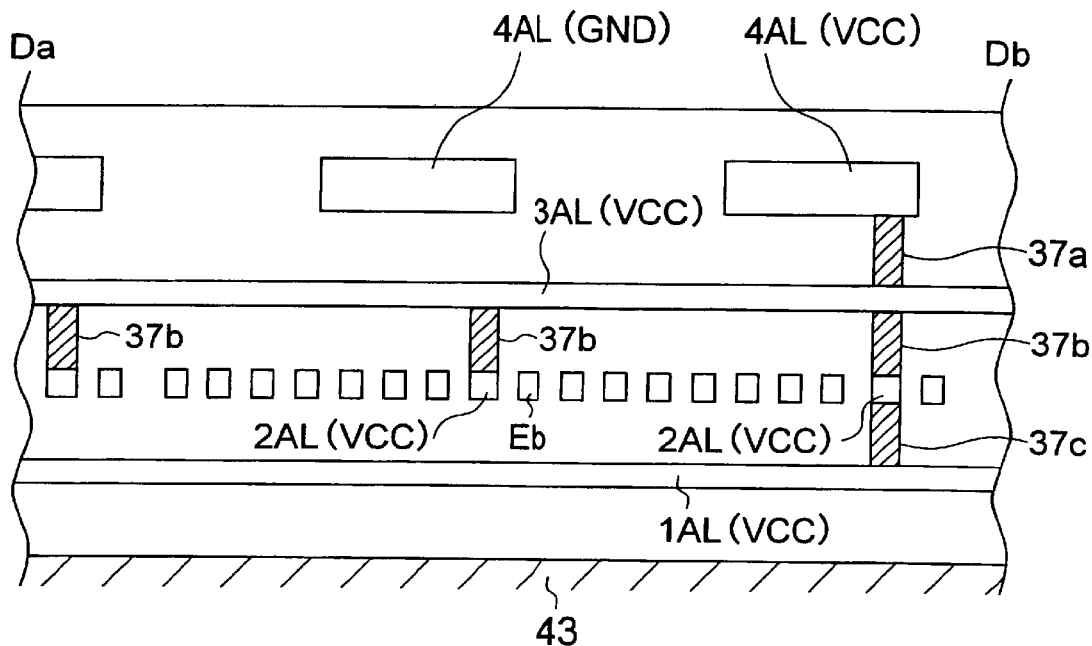
FIG. 7 is a sectional view taken along line VII—VII in FIG. 6.
Figure 8:
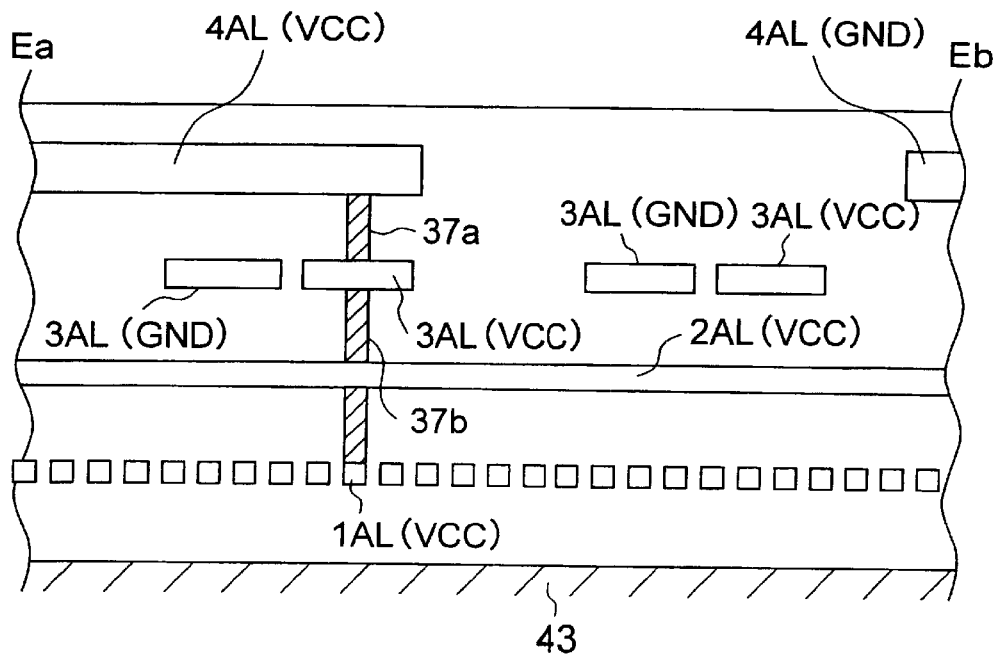
FIG. 8 is a sectional view taken along line VIII—VIII in FIG. 6.

Referring to FIGS. 7 and 8 showing cross-sections taken along line VII—VII and line VII—VIII, respectively, of FIG. 6, the LSI includes a semiconductor substrate 43, first through fourth layer Al interconnect lines 1AL to 4AL consecutively formed to overly the semiconductor substrate 43. Each of the source lines formed as the first layer interconnect lines 1AL is connected through a via plug 37c to a corresponding one of the source lines of the second layer interconnect lines 2AL, which is then connected to a corresponding one of the third layer interconnect lines 3AL and the fourth layer source lines 4AL through respective via plugs 37b and 37a, whereby the fourth layer source lines 4AL supply power source to the memory cell through the third to first layer source lines 3AL, 2AL and 1AL. Although not depicted in the drawing, the MPU 13 is directly connected to one or more of the fourth layer source lines 4AL.

In the present embodiment, since the diagonal source lines implemented by the fourth layer interconnect lines 4AL can be connected to the third layer source lines 3AL through via plugs 37a, the third layer source lines 3AL can be disposed at a desired pitch substantially free from the arrangement of the bonding pads 33. The first and the second layer source lines 1AL and 2AL allow the cell current to flow through only a limited length of the first and second layer source lines because desired current can be supplied thereto mostly from the portions of the third layer source lines 3AL disposed in the vicinity of the limited length of the first and second layer source lines 1AL and 2AL. Thus, the first and second source lines 1AL and 2AL may have a small width, which allows the sense amplifiers 31 and the word drivers 32 to occupy only small areas, which in turn allows a larger area for the memory cells.

In addition, the third layer source lines 3AL forming meshes and disposed between the fourth layer source lines 4AL and the second layer signal lines receiving data from the sense amplifier 31 function as a shield layer therebetween. This prevents noise generated by the MPU 13 on the fourth source lines 4AL from affecting the signal transfer along the second layer signal lines 2AL.

Moreover, the fourth layer source lines can be arranged mostly for locational efficiency of the LSI conforming to the restriction from the area 18 of the DRAM macro blocks 15a nd 15b. The separation of the third layer source lines from the fourth layer source lines prevents the noise generated by the MPU 13 from affecting the operational margin of the DRAM macro blocks 15a and 15b. A pre-charge source lines for the DRAM macro blocks 15a and 15b, which may be also implemented by the third layer interconnect lines 3AL and disposed between two of the third layer source lines, can be substantially free from the noise from the fourth layer interconnect lines 4AL.

Since the above embodiments are described only for examples, the present invention is not limited to the above embodiments and various modifications or alterations can be easily made therefrom by those skilled in the art without departing from the scope of the present invention.

What is claimed is:

1. A large scale semiconductor integrated circuit, implemented on a chip, comprising:
   a microprocessor (MPU) disposed substantially in a central area of a chip;
   a dynamic random access memory (DRAM) cache memory including at least one DRAM macro block, having a plurality of memory cells arranged in a matrix, which is located near a corresponding side of said MPU, each of said at least one DRAM macro block having a peripheral circuit that includes a memory redundancy function implemented by a plurality of fuses, wherein said plurality of fuses occupies a plurality of areas of said chip;
   a plurality of bonding pads disposed near edges of said chip;
   a plurality of overlying interconnect lines including at least a pair of source lines connected between said MPU and said plurality of bonding pads, wherein said plurality of overlying interconnect lines circumvents said plurality of areas occupied by said plurality of fuses; and
   a plurality of underlying interconnect lines disposed beneath said plurality of overlying interconnect lines and extending in directions substantially parallel to rows and columns of said matrix of said plurality of memory cells, said plurality of underlying interconnect lines including at least a pair of source lines connected to said at least a pair of overlying source lines and to said at least one DRAM macro block.

2. The large scale semiconductor integrated circuit as defined in claim 1, wherein at least one of said at least a pair of overlying source lines extends in directions diagonal to those of said plurality of underlying interconnect lines.

3. The large scale semiconductor integrated circuit as defined in claim 1, wherein said plurality of interconnect lines are implemented by at least four metallic layers, consecutively disposed from a bottommost metallic layer to a topmost metallic layer, said topmost metallic layer implementing said at least a pair of overlying source lines and a plurality of signal lines connected to said MPU and said bonding pads, an intermediate metallic layer disposed directly beneath said topmost metallic layer that implements said at least a pair of source lines of said plurality of underlying interconnect lines, and a plurality of lower metallic layers.

4. The large scale semiconductor integrated circuit as defined in claim 3, wherein said plurality of fuses that are to be cut by laser beam, comprise a portion of said underlying interconnect lines, and said at least a pair of overlying source lines and said plurality of signal lines of said topmost metallic layer circumvent said plurality of areas of said chip occupied by said plurality of fuses.

5. The large scale semiconductor integrated circuit as defined in claim 3, wherein each of said plurality of lower metallic layers includes at least a pair of source lines connected between a corresponding pair of said at least a pair of source lines of said plurality of underlying interconnect lines of said intermediate metallic layer and said memory cells.

6. The large scale semiconductor integrated circuit as defined in claim 3, wherein said intermediate metallic layer functions as a shield layer for shielding said plurality of lower metallic layers from said topmost metallic layer.

7. The large scale semiconductor integrated circuit as defined in claim 3, wherein said intermediate metallic layer includes at least a pair of pre-charge source lines for each of said at least one DRAM macro block.

8. A large scale integrated circuit, implemented on a chip, comprising:
   a microprocessor unit (MPU);
   a plurality of bonding pads located near edges of said chip;
   at least one dynamic random access memory (DRAM) macro block of a DRAM cache memory located near a corresponding side of said MPU, each of said at least one DRAM macro block having a peripheral circuit that includes a memory redundancy function implemented by a plurality of fuses, wherein said plurality of fuses occupies a plurality of areas of said chip;
   a topmost metallic layer having a plurality of interconnect lines that connect signals between input/output ports of said MPU and said bonding pads, between said bonding pads and said at least one DRAM macro block, and between said MPU and said at least one DRAM macro block and that includes at least a pair of source lines, which connect said MPU and said bonding pads, wherein said plurality of interconnect lines of said topmost metallic layer circumvents said plurality of areas occupied by said plurality of fuses;
   an intermediate metallic layer, located directly beneath said topmost metallic layer, that includes said plurality of fuses and at least a pair of source lines connected to said at least a pair of source lines of said topmost metallic layer; and
   a plurality of lower metallic layers, located beneath said intermediate metallic layer, each of said plurality of lower metallic layers including at least a pair of source lines, connected to said at least a pair of source lines of said intermediate metallic layer and to memory cells of said at least one DRAM macro block, and a plurality of data lines connected to said memory cells of said at least one DRAM macro block, wherein each source line of said at least a pair of source lines of said intermediate metallic layer has a larger width than each source line of said at least a pair of source lines of each of said plurality of lower metallic layers.

9. The large scale integrated circuit as defined in claim 8, wherein said MPU is located midway near an edge of said chip with sides of said MPU being substantially parallel to said edges of said chip.

10. The large scale integrated circuit as defined in claim 8, wherein said MPU is located substantially in a central area of said chip with sides of said MPU being substantially parallel to said edges of said chip.

11. The large scale integrated circuit as defined in claim 8, wherein said intermediate metallic layer further includes at least a pair of pre-charge source lines for each of said at least one DRAM macro block.

12. The large scale integrated circuit as defined in claim 8, wherein said at least a pair of source lines and said plurality of data lines of each of said plurality of lower metallic layers extends in directions substantially parallel to directions of rows and columns of a matrix of memory cells of each of said at least one DRAM macro block.

13. A method of interconnecting components of a large scale integrated circuit, implemented on a chip, the method comprising:

locating a MPU with sides of said MPU being substantially parallel to edges of said chip in one of two positions, either midway near an edge of said chip or substantially in a central area of said chip;

disposing a plurality of bonding pads near said edges of said chip, wherein a pitch of said bonding pads is greater than a pitch of connections to said MPU;

locating at least one DRAM macro block of a DRAM cache memory along a side of said MPU;

disposing a peripheral circuit, having a plurality of fuses, that corresponds to each of said at least one DRAM macro block adjacent to said side of said MPU, said plurality of fuses occupying a plurality of areas of said chip;

routing a plurality of interconnect lines of an topmost metallic layer between input/output ports of said MPU and said bonding pads, between said bonding pads and said at least one DRAM macro block, between said MPU and said at least one DRAM macro block and between at least a pair of source lines, which connect power and ground to said MPU and said bonding pads, such that, said plurality of interconnect lines of an topmost metallic layer circumvents said plurality of areas occupied by said plurality of fuses;

forming an intermediate metallic layer directly beneath said topmost metallic layer that includes said plurality of fuses and at least a pair of source lines;

connecting said at least a pair of source lines of said topmost metallic layer to said at least a pair of source lines of said intermediate metallic layer by via plugs;

connecting at least a pair of source lines of each of a plurality of lower metallic layers, located beneath said intermediate metallic layer, to a corresponding pair of source lines of said intermediate metallic layer by via plugs;

connecting said at least a pair of source lines of each of a plurality of lower metallic layers to memory cells of said at least one DRAM macro block;

connecting a plurality of data lines of each of a plurality of lower metallic layers to memory cells of said at least one DRAM macro block; and forming each source line of said at least a pair of source lines of said intermediate metallic layer with a larger width than each source line of said at least a pair of source lines of each of said plurality of lower metallic layers.

14. The method of interconnecting components of a large scale integrated circuit as defined in claim 13, the method further comprising:

testing said at least one DRAM macro block to identify defective rows of a memory cell array; and cutting appropriate ones of said plurality of fuses corresponding to each of said at least one DRAM macro block to implement a redundancy function, whereby a row of a redundancy memory cell array replaces a corresponding defective row of said memory cell array.

15. The method of interconnecting components of a large scale integrated circuit as defined in claim 13, wherein said forming an intermediate metallic layer that includes at least a pair of source lines disposes said at least a pair of source lines at a pitch, which does not correspond to said pitch of said bonding pads.

16. The method of interconnecting components of a large scale integrated circuit as defined in claim 13, wherein said forming an intermediate metallic layer that includes at least a pair of source lines creates a shield between said topmost metallic layer and said plurality of lower metallic layers.

17. The method of interconnecting components of a large scale integrated circuit as defined in claim 13, the method further comprising:

forming at least a pair of pre-charge source lines for each of said at least one DRAM macro block.

* * * * *